United States Patent [19]

Vetter et al.

[11] Patent Number: 5,069,235
[45] Date of Patent: Dec. 3, 1991

[54] APPARATUS FOR CLEANING AND RINSING WAFERS

[75] Inventors: William L. Vetter, American Fork; Dennis L. Mortensen, Sandy, both of Utah

[73] Assignee: Bold Plastics, Inc., West Jordan, Utah

[21] Appl. No.: 561,778

[22] Filed: Aug. 2, 1990

[51] Int. Cl.$^5$ .............................................. B08B 3/04
[52] U.S. Cl. .................................... 134/113; 134/182; 134/186; 134/902
[58] Field of Search ............... 134/902, 113, 182, 183, 134/186, 198, 199, 99; 68/181 R, 208; 422/292, 300

[56] References Cited

U.S. PATENT DOCUMENTS

| | | | |
|---|---|---|---|
| 4,092,176 | 5/1978 | Kozai et al. | 134/902 X |
| 4,325,394 | 4/1982 | Reams | 134/902 X |
| 4,361,163 | 11/1982 | Aigo | 134/902 X |
| 4,601,300 | 7/1986 | Sundheimer | 134/186 X |
| 4,753,258 | 6/1988 | Seiichiro | 134/902 X |
| 4,934,392 | 6/1990 | Henfrey | 134/186 X |
| 4,955,402 | 9/1990 | Miranda | 134/902 X |

FOREIGN PATENT DOCUMENTS 782379  9/1957  United Kingdom ................ 134/182

Primary Examiner—Philip R. Coe
Attorney, Agent, or Firm—Terry M. Crellin

[57] ABSTRACT

Apparatus for cleaning and rinsing wafers is disclosed. The apparatus includes an inner tank contained within an outer tank. The inner tank has an open top forming a weir edge around the entire top of the tank. A bottom opening in the inner tank is covered by a dump door. The inner tank is contoured so that its cross-sectional area decreases in a direction toward the bottom of the tank. Sprayer manifolds are positioned slightly above the top edge of the inner tank to spray water into the inner tank. Wafers are positioned in the inner tank on a support plate. Manifolds below the support plate allow filling of the tank with water and nitrogen gas. The dump door is opened or closed by a pneumatic piston depending on whether the inner tank is being dumped or filled. A controller operates the apparatus to cycle through a predetermined program including dump, partial dump, cascade and spraying cycles. A monitoring system withdraws water from the outer tank and monitors the water for particular characteristics including resistivity, conductivity and redox potential.

16 Claims, 5 Drawing Sheets

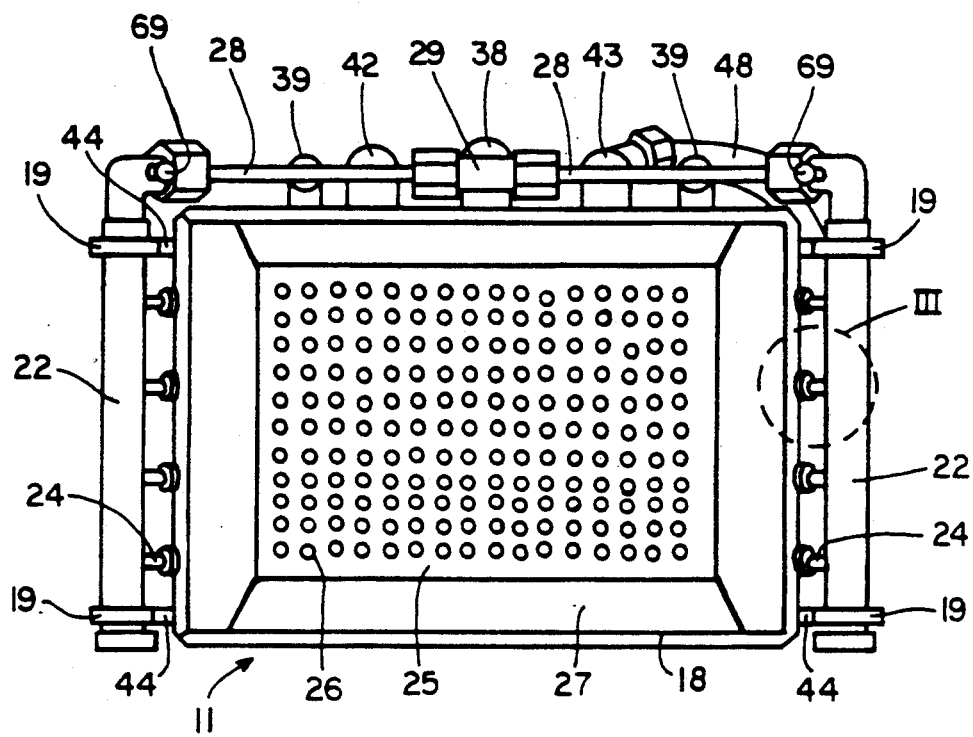
FIG. 3a
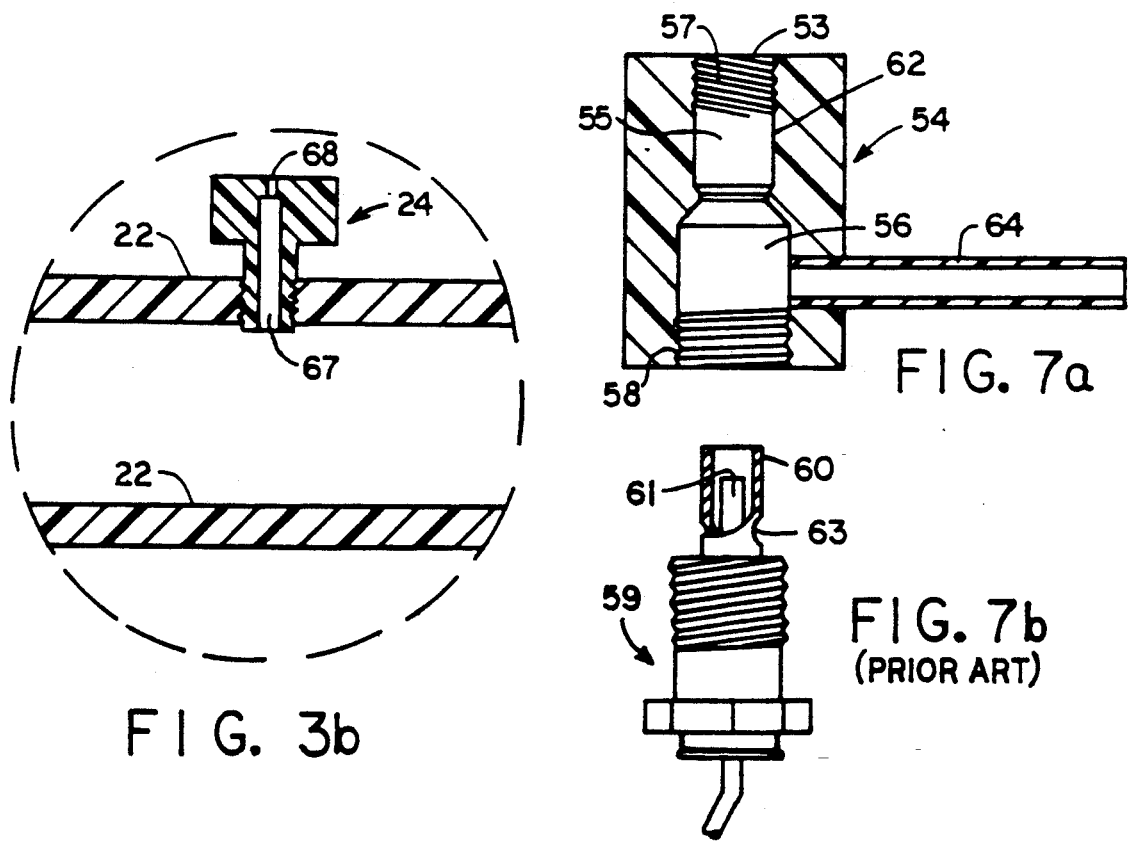
FIG. 3b
FIG. 7a
FIG. 7b
(PRIOR ART)

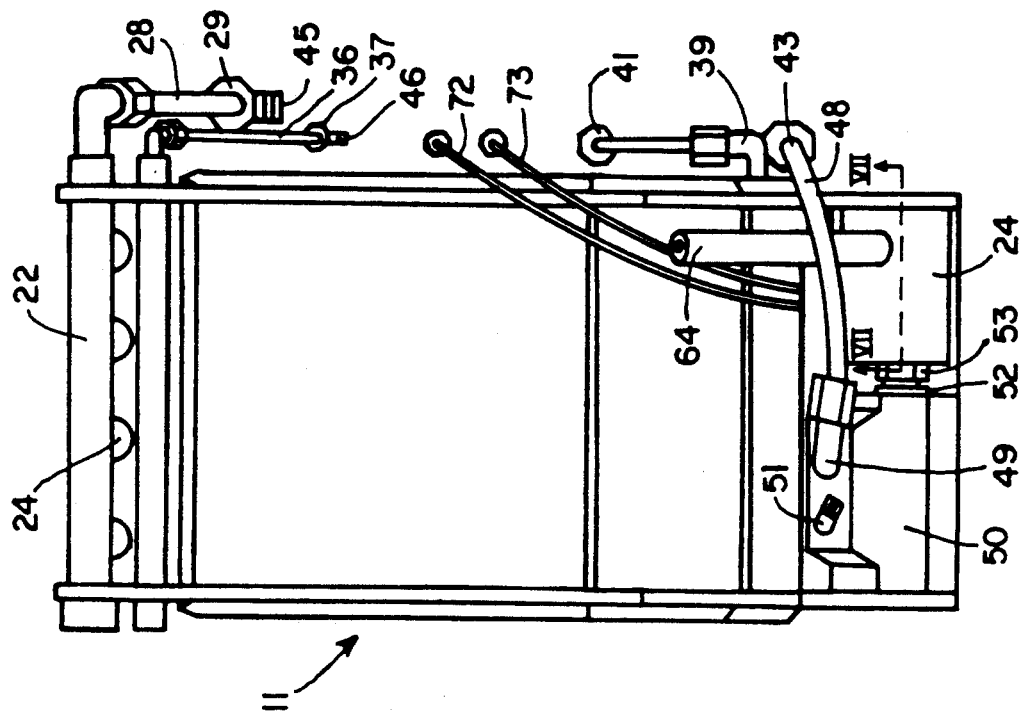
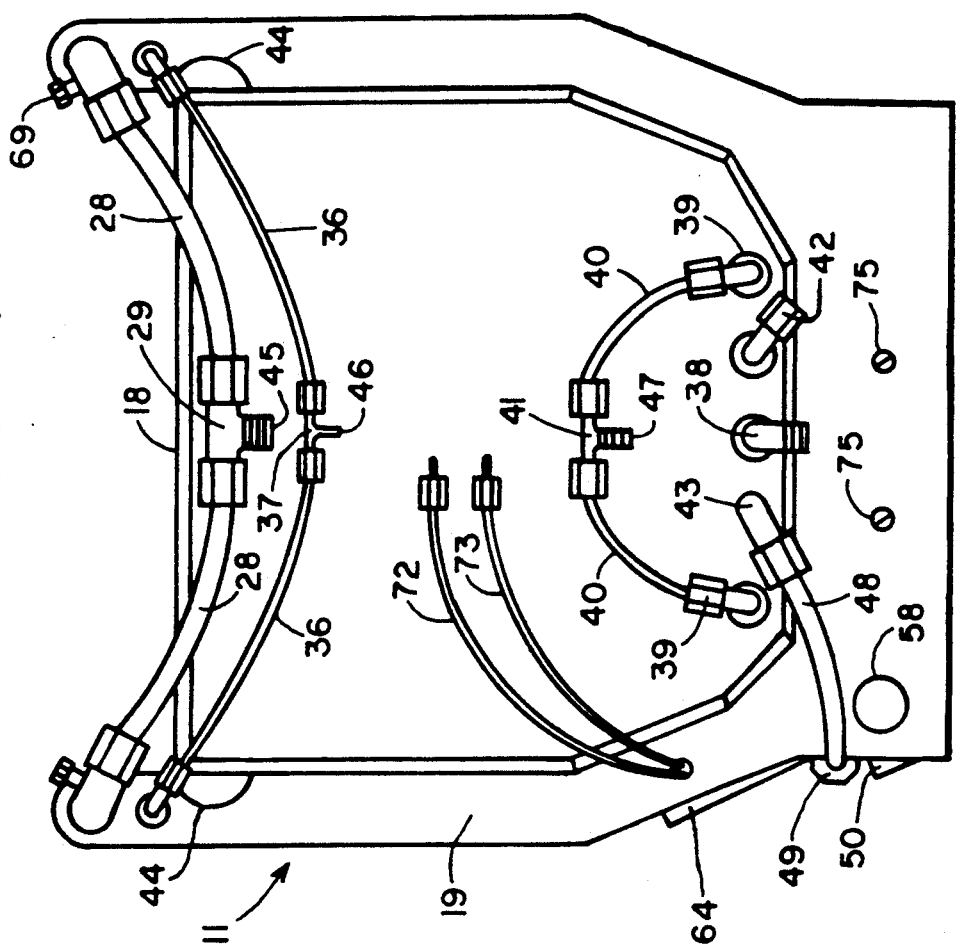

APPARATUS FOR CLEANING AND RINSING WAFERS

BACKGROUND OF THE INVENTION

1) Field of the Invention

This invention relates generally to an apparatus for cleaning disc like elements such as silicone wafers. More specifically, the present invention relates to an apparatus for cleaning and rinsing silicone wafers in the semiconductor process industry.

2) Prior Art

In the process of manufacturing integrated semiconductor circuits or semi-conductor devices using a semiconductor wafer, various impurities tend to be defused onto the surface of the wafers. Metalization, deposition, diffusion and etching processes on the wafers thereafter can be affected by the impurities. For example, metalization layers can be affected to the point that, electrical pathwaves intended to be formed by the metalization layer may be severely reduced in size or even completely blocked by the impurities. This results in either malfunctioning of the integrated circuit in the case of a short circuited electrical pathways, or impairment resulting in eventual malfunctioning due to heating and eventual shorting of a partially blocked electrical pathway.

In the case of a deposition process, impurities on the wafer surface can cause irregular or oxide growth, resulting in "lumpiness" of the deposition layer.

Also, in the case of diffusion processing of wafers, impurities such as inorganic particulates can cause deflection of the layering material resulting in an uneven diffusion layer.

It is necessary therefore prior to forming metalization, deposition, diffusion, etc., layers on semi-conductor wafers, to take steps to free the wafer surfaces of solid matter, films, chemical impurities and solvents which may have been absorbed during prior steps in the manufacturing process.

Further, it is often an important part of the rinsing process to complete the eching stop of a previous process. The ech stop must be reliable and must be completed within a predictable time period. It is therefore necessary to be able to monitor impurity levels corresponding to the amount of echant present in the rinsing apparatus in order to insure a proper etch stop.

Several prior art processes have been developed to clean and rinse wafers prior to further processing operations. These processes have been discussed in applicant's co-pending patent application entitled "METHOD FOR CLEANING AND RINSING WAFERS", application Ser. No. 07/561,805, and now U.S. Pat. No. 4,997,490, the disclosure of which is incorporated herein by reference.

Many attempts have been made to develope apparatus' useful for performing cleaning and rinsing processes. These devices have been developed and used with only limited success however. Such prior art devices generally include a chamber into which a plurality of wafers have been located. The chamber is then either completely filled with a fluid such as deionized water and quickly emptied (dumped) with the filling and emptying being repeated a preset number of cycles. Alternatively the chamber has been fitted with a means of spraying water or steam, or the like against the wafers in such a manner as to dislodge particular impurities. Other prior art devices employ similar chambers to allow water to continuously flow past the wafers to remove the impurities (usually referred to as Cascade-type rinsers), and may include the use of megasonics in conjunction with the fluid flow.

There has been no suggestion of an apparatus for cleaning and rinsing wafers which is capable of long and repeated sequences of cycles which involve the use of a tank for holding a plurality of wafers, with the tank being capable of filling and dumping, with subsequent simultaneous cascading and spraying of water over the top of the tank.

Further there has been no suggestion to develop a tank type apparatus which allows a partial dump of the water in the tank to allow for useful exchange of fresh water thereinto while preventing the wafers therein from being exposed to air.

Further the development of an apparatus which can perform a sequence of full water dump steps, in combination with partial dumps and/or full cascading steps including a delayed spray step to minimize the liquid-/air interface with the wafers has yet to be suggested. The minimization of exposure of wavers to air limits the potential oxide regrowth and particulate contamination therefrom. The combination of cascading and spraying with partial dumping of the tank, which has yet to be suggested in the prior art, allows for sprays to remove the light weight contaminates from the surface of the tank, while at the same time allowing for partial dumps to remove heavy contaminates from the bottom of the tank.

Also, there has been no suggestion to combine each of these capabilities into a tank apparatus which also includes the ability to monitor any one of a number of characteristics including chemical characteristics, corresponding to the level of contaminates within the tank water. Further, this has never been successfully performed with a monitor which is isolated from the tank so as to avoid the introduction thereby of contaminates which can subsequently become deposited on the wafers.

Further, there has been no suggestion to measure the characteristics of the water which correspond to contaminates therein, for the purpose of controlling the operation of the rinsing and cleaning cycles of the apparatus in such a manner as to optimize the effectiveness thereof, and minimize the total volume of water, consumed thereby.

OBJECTS AND SUMMARY OF THE INVENTION

It is an object of the present invention to provide an apparatus which can effectively clean and rinse wafers to remove particulates, chemical impurities, solvents, and etc. therefrom so as to prepare the wafers for further processing.

It is another object of the present invention to provide an apparatus which can optimize the cleaning and rinsing of wafers by allowing for dumping, partial dumping, spraying and/or cascading steps to be performed simultaneously or serially, in a manner which optimizes the cleaning effect of the water while minimizing water consumption.

It is further an object of the present invention to provide an apparatus which includes a monitoring system which allows for continuous monitoring of characteristics of the water which relate to the quantity of impurities therein, the monitoring system being isolated from the water exposed to the wafers so as to prevent any contamination thereof due to presents of the monitoring system.

It is another object of the present invention to provide an apparatus which also allows injection of chemicals such as oxidizing agents or chemical bases which inhibit oxide regrowth and improve rinsing characteristics of the water.

It is another object of the present invention to provide an apparatus which minimizes exposure of wafers to air.

Another object of the present invention is to provide an apparatus which minimizes the degradation of the water resistivity.

It is further an object of the present invention to provide an apparatus which allows for the introduction of hot water to the wafers in order to reduce the surface tension adhesion characteristics of certain chemicals as well as maintain a high solubility level for saturated buffered oxidite etchants.

It is also an object of the present invention to provide an apparatus which is designed to prevent the wafers therein from being exposed to a vacuum during a dumping cycle, which can cause contaminates to be pulled across the wafer surface.

It is another object of the present invention to provide an apparatus which allows for water to pass through all systems thereof at a minimal flow rate regardless of the particular cycling steps being performed, the constant dynamic movement of water in the apparatus functioning to inhibit bacteria growth.

It is another object of the present invention to provide an apparatus which includes no gaskets, sealing materials, metals, or other elements which could possibly come into contact with the wafers (or the water exposed to the wafers) in the apparatus so as to prevent particulate or chemical contaminate thereof.

These and other objects of the present invention are realized in a particulate embodiment of a rinsing and cleaning apparatus which includes a tank formed entirely of polymeric material such as polypropelene, PVDF, and/or Teflon which is formed with smooth continuous Interfaces. The interior surfaces of the tank are shaped to conform to the configuration of the circular disc like wafers when such are located therein in side by side parallel spaced apart relationship and held in their proper position by supporting devices commonly referred to as "boats". The tank includes a boat support platform located adjacent the bottom thereof on which the boats are placed and below which, at the bottom of the tank, pass a water inlet manifold system, a nitrogen gas manifold system, a chemical injection port system and a fluid monitoring port. The tank is sized to allow water therein to completely submerge the wafers located therein and has its upper edge formed into a weir about its entire circumference for purposes of allowing water to cascade thereover to remove light weight contaminates from the tank. The support plate has a plurality of uniform openings therethrough which allow flow from the water manifold system, the nitrogen manifold system, and the chemical injection system, to pass therethrough to fill the tank, the tank being contoured in such a manner that the flow characteristics of the water and nitrogen across the wafers are optimized for particulate and chemical removal therefrom with minimization of redeposition thereof onto other wafers. Also, the contours of the tank allow for complete, "clean" dumping of water out of the bottom thereof in a vortex-form manner which tends to pull contaminates out of the tank.

The tank is supported by a pair of U-shaped support members which are located in relative spaced apart relationship which cradle the tank in the U-shaped openings thereof. The support members extending above the upper edge of the tank and have attached therebetween a spray manifold system and a nitrogen blanketing manifold system. The bottom of the support members pass below the bottom of the tank and support a pneumatically operated door which is located over an opening in the bottom of the tank to be actuated to cause the complete or partial dump of water from the tank. The bottom portion of the support members also have attached thereto a valve and monitor housing assembly which is in fluid flow connection with the fluid monitoring port, the monitor housing being adapted to accept any of a number of water monitoring devices such as a resistivity probe, redox probe, conductivity probe, etc. which are themselves attached to a controller which can be programmed to control the flow of water and nitrogen into and out of the tank in any of the predetermined dump, partial dump, spray or cascade type cleaning cycles, the controller also being capable of modifying or discontinuing program cycles depending on the data received from the monitoring device in conjunction with other preprogrammed information.

The tank and its entire supporting structure may be inserted into an outer tank which includes a drain therein which can be adapted for dumping water used in the apparatus to a reclaiming system. The other tank also functions to prevent the dumping water from creating a vacuum in the inner tank which could cause contaminates to be pulled across the wafer surfaces.

BRIEF DESCRIPTION OF THE DRAWINGS

FIG. 3(a) is a top view of the inner tank portion of the apparatus of the present invention without the wafers present;

FIG. 3(b) is an enlarged view of the area designated as III in the dashed line circle of FIG. 3(a);

FIG. 4 is a front view of the inner tank portion of the present invention;

FIG. 5 is a side view of the inner tank portion of the present invention;

FIG. 7(a) is a cross-sectional view of the monitor housing taken along line VII-VII of FIG. 5;

FIG. 7(b) is a partial cross sectional view of a prior art probe of the type jusable in conjunction with the present invention;

DETAILED DESCRIPTION OF THE INVENTION

Figure 1:
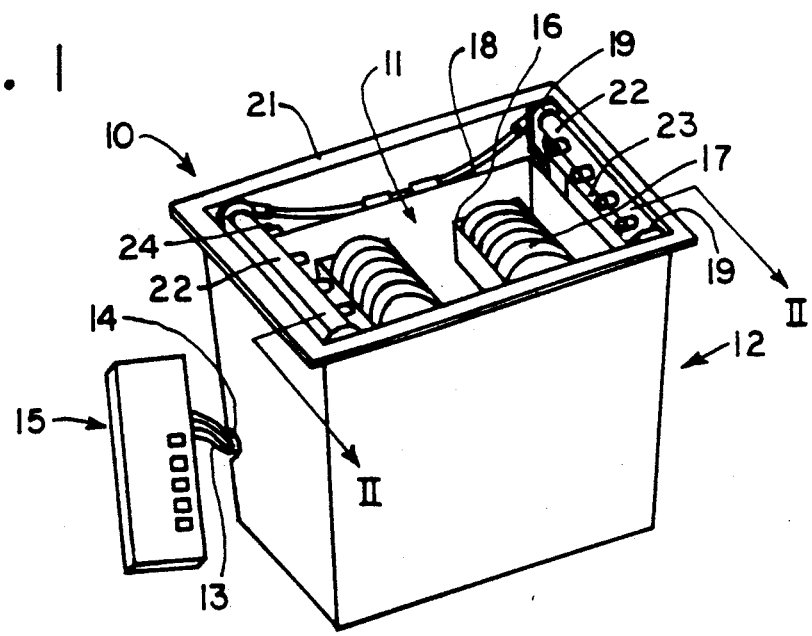
FIG. 1 is a perspective view of the cleaning and rinsing apparatus of the present invention including wafers positioned therein for cleaning.

A preferred embodiment of the present invention is illustrated in FIG. 1 wherein there is shown an apparatus 10 having an inner tank 11 placed in and completely surrounded by an outer tank 12. The inner tank 11 is accessed by pneumatic lines 13 through a control opening 14 in the outer tank 12. Controller 15 is attached to the pneumatic lines 13 and functions to control cleaning and rinsing process cycles and also to monitor the water quality inside the inner tank 11 in a manner which will hereinafter be explained.

The inner tank 11 has a set of boats 16 which can hold a plurality of wafers 17 in side by side spaced apart parallel configuration.

The term wafers as used in the present application is intended to include any objects which must be cleaned and/or rinsed during a manufacturing process specifically, objects formed of materials such as gallium arsenide, glass substrates, and/or piellicle or reticle masks of polyamide material.

The wavers are placed into the inner tank 11 and so situated (because of the shape and volume of the tank) to be located completely interiorly thereof. The top edge of the tank 11 is formed as a weir edge 18 which, is completely unobstructed around its entire 360 degree circumference. The weir edge 18 allows for completely unobstructed flow of water thereover so as to maximize the passage of light weight contaminates out of the tank 11 during operation.

Inner tank support members 19 support the inner tank 11 above the bottom 20, and below the rim 21 of the outer tank 12 so as to completely surround it for purposes which will be more clearly explained hereafter. Each arm of the support members 19 is formed with a semi-cylindrical notch 44 located therein slightly below the upper nitrogen manifolds 23. The notches 44 cause the arms of the support members 19 to attach to the tank 11 at a location slightly below the weir edge 18 thereof. The notches 44 thereby function to allow water to flow over the weir edge 18 in an even, uniform manner without interference or backflow being caused by the support members 19.

The support members 19 also function to secure the ends of sprayer manifolds 22 and nitrogen manifolds 23. The sprayer manifolds 22 and hydrogen manifolds 23 are sized to extend along the entire length of opposing sides of the inner tank 11 and located at a level slightly above the weir edge 18 thereof. The sprayer manifolds 22 include spray nozzles 24 which function to direct a spray of water into the inner tank 11 to aid in the cleaning of the wafers 17 during certain stages of the cleaning process in a manner which will also be explained hereinafter.

Figure 2:
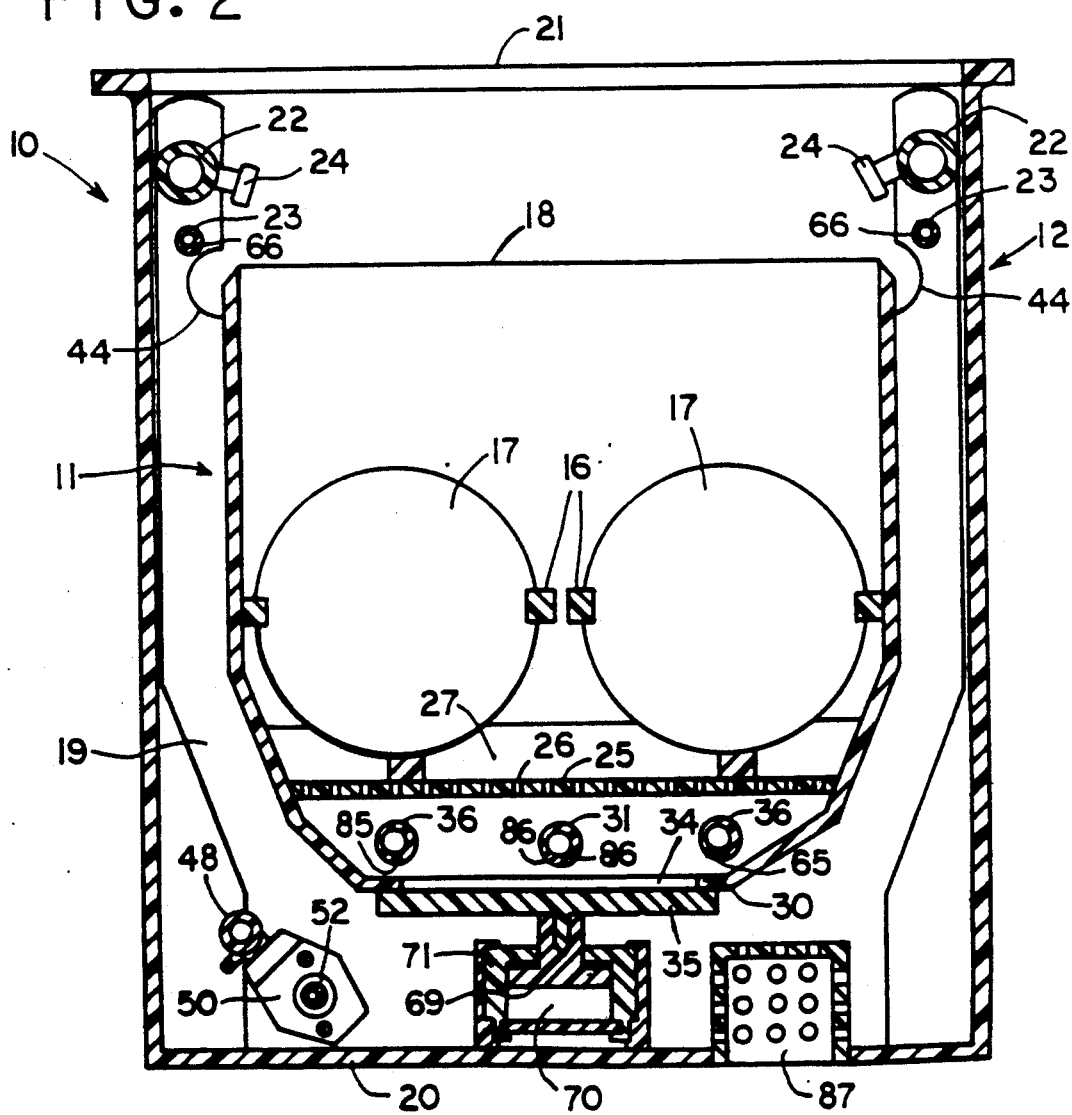
FIG. 2 is a cross-sectional view of the apparatus of the present invention taken along line II—II of FIG. 1.

As shown in FIGS. 2 and 3, the inner tank 11 includes a support plate 25 therein which expands across the entire length and width of the tank 11 to form a false bottom therein. Support plate 25 effectively functions to hold the wafers 17 above the bottom 30 of the tank 11 and forms an area in the bottom of the tank through which the water manifold 31 and nitrogen manifolds 32 are located. The supporting plate 25 includes a plurality of circular openings 26 therethrough which are uniformly sized and spaced across the entire support plate 25. The openings 26 function to allow liquid such as deionized water, including particulates and chemicals mixed therewith, and also gas such as nitrogen, to pass upwards therethrough during filling and cascading, and downward during dumping.

The support plate 25 is held in its position in the tank 11 by a pair of positioning wings 27 which are formed integrally therewith and which angle upwardly away from the opposing sides of the support plate 25 to contact opposing walls of the tank 11. The support plate 25 in conjunction with the positioning wings 27 and the interior shape of the tank 11, cooperate to form the interior of the tank 11 into contours which match the contours of the conventional wafer boats 16 which are to be placed therein. The result is that fluid entering the tank from below the support plate 25 is forced into a uniform upward flow past the wafers 17 in such a manner as to encourage uniform removal of particulates from the wafers surfaces as the fluid flows therepast, while at the same time minimizing the opportunity of the removed particulates from being redeposited on other wafer surfaces.

Also, the contoured shape of the tank tends to smoothly funnel fluid out of the bottom opening 34 thereof when dump door 35 is opened. The slope of the tank prevents water from pooling at any location so as to remain in the tank 11 after the dump is complete. Further, the contoured shape of the tank 11 causes the water path to narrow as it drains toward the bottom 30 of the tank 11. This results in an increase in velocity of the draining water as it approaches the opening 34. The increased velocity tends to pull particulates out of the tank in a more effective manner than conventional prior art devices are capable of. As the draining water approaches very near to the opening 34 it may even tend to form a vortex which then significantly augments the effectiveness of the draining water to pull particulates along with it as it leaves the tank 11.

The bottom 30 of the tank 11, due to the contours of the tank, is nearly square in shape and has formed therein the large circular bottom opening 34 which is completely blocked by dump door 35.

As best seen in FIG. 2 and 4, the inner tank support members 19 are generally of a U-shaped configuration each having a central portion which support the bottom 30 of the tank 11, and a pair of spaced apart arms which tend to support the sides thereof. The arms extend above the top (weir) edge 18 of the inner tank 11 and support the sprayer manifolds 22 and nitrogen blanket manifolds 23 as previously explained.

Sprayer manifolds 22 are held above each end of the tank by the supports 19, and oriented in spaced apart relationship to each other. Each orifice 22 is connected through a spray line 28 to a T-connector 29.

Each nitrogen blanket manifold 23 is also held in a position slightly above and parallel with the sides of the inner tank 11, and each is connected by a nitrogen flow line 36 to a T-connector 37 in a manner identical to the connection of the spray manifolds 22, except that the spray manifolds 22 are located a slightly larger distance above the top edge 18 of the tank 11 than the nitrogen blanket manifolds 23.

The water manifold 31 (in the bottom area of tank 11) and the nitrogen bubble manifolds 32 are connected to water inlet port 38 and nitrogen inlet ports 39 respectively. The nitrogen inlet ports 39 are connected through nitrogen flow lines 40 to T-connector 41 in a manner similar to the nitrogen blanket manifolds 23.

Also located through the inner tank are the chemical injection port 42 and the fluid test port 43. The ports 42 and 43 are not connected to a manifold inside the tank 11, but are nevertheless in fluid flow connection with the tank interior.

The T-connector 29, which connects spray manifolds 22, also includes a water inlet port 45 which is attachable to a source of fluid such as deionized water. The connection of the water source to inlet port 45 is not shown in the drawings for the sake of simplicity, but nevertheless can be accomplished with any type of connection. It is important to note however that the water source entering inlet port 45 must be controllable by a valve such as a well known type prior art valve (a specific example of which could be a "white bandit" all plastic (TEFLON) valve manufactured by Fluorocarbon, of Anaheim Calif.) which is capable of being controlled by the controller 15, and which will not add contaminates or particulates to the water or fluid flowing therethrough.

As best shown in FIG. 3(b) the spray nozzles 24 located in spray manifolds 22 are formed as extensions which protrude radially outwardly from the spray manifold 22 in a direction so as to allow spray passing through the orifice 67 thereof to be directed into the inner tank 11. Each orifice 67 has a reduced diameter outlet opening which increases the velocity of water as it exists the nozzle in order to cause a spraying effect. The reduced diameter outlet opening 68 is sized to form relatively large droplets, with relatively low surface area to volume ratios in order to avoid significant degradation of the water resistivity. The spray can be controlled according to the inlet pressure by means of flow adjustment screws 69 located next to the attachment of the spray manifold 22 with the sprayline 28 (see FIG. 3(a)). The average diameter of the spray droplets should be at least 1000 microns so as to prevent atomization. The nozzles 24 (in conjunction with the manifold 22, are preferably capable of full cone, 10-80 degree adjustability.

Referring again to FIG. 4, T-connector 37 and T-connector 41 which are attached to blanket and bubble nitrogen manifolds 23 and 39 respectively, include inlet ports 46 and 47 respectively which can be attached in any manner to a conventional source of nitrogen gas. Preferably, the nitrogen gas source can be controlled, as by a 0.07 inch orifice, to deliver approximately 2-5 cubic feet per hour through the bubble manifolds 39, and by a 0.16 inch orifice to deliver approximately 10 cubic feet per hour through the blanket manifolds 39. It is important that the flow of nitrogen gas into inlet 47 be controllable by controller 15. Blanket and bubble nitrogen manifolds 23 and 39 respectively distribute the nitrogen flow therethrough in an even manner along their entire lengths through a plurality of outlet orifices 66 and 65 respectively.

As best seen in FIGS. 4 and 5, fluid test port 43 is connected by fluid test line 48 to an inlet port 49 of pneumatic valve 50. The pneumatic valve 50 may also be of a conventional design such as the valve described above in connection with the fluid source attached to port 45 of the T-connector 29.

The valve 50 includes a pneumatic valve control port 51 which is connectable in a conventional manner to the controller 15 for pneumatic actuation thereby according to a pre-determined program. Water outlet 52 of valve 50 is connected by a very short conduit directly to water outlet 53 of the probe housing 54.

As best seen in FIG. 5 and FIG. 7(a) probe housing 54 has formed therein an elongated cylindrical channel 55 extending inwardly from the inlet 53 thereof. A second elongated cylindrical channel 56 is also formed in the housing 54 in the direction opposite channel 55 and connects with channel 55, channel 56 being of a slightly larger diameter. Channels 55 and 56 include threads 57 and 58 respectively. Threading 57 is used to connect the valve 50 to the inlet 53 of channel 55, and threading 58 is used to connect the probe 59 in a water tight manner to the housing 54.

As shown in FIG. 7(b) the probe 59 is of a standard prior art construction which includes an elongated cylindrical tubular outer electrode 60 with an elongate cylindrical inner electrode 61 located therein. The outer electrode 60 includes openings 63 adjacent the base thereof. The probe 59 functions by allowing fluid to pass along the inner and outer surfaces of outer electrode 60, with fluid passing along the interior surface thereof also passing along the exterior surface of inner electrode 61 until it reaches opening 63 and is allowed to exit from the interior of the probe.

Figure 8A:
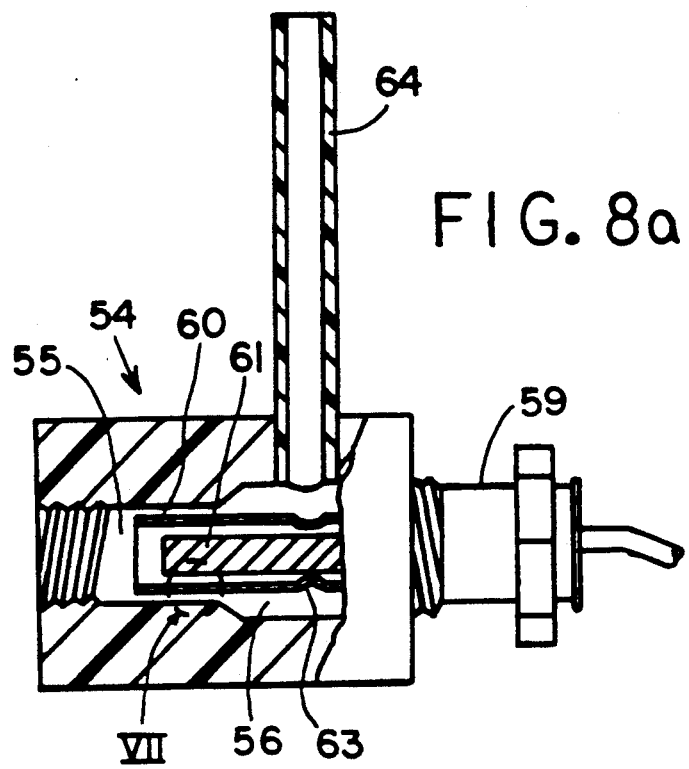
FIG. 8(a) is a partial cross sectional view of the housing and probe in their connected position.
Figure 8B:
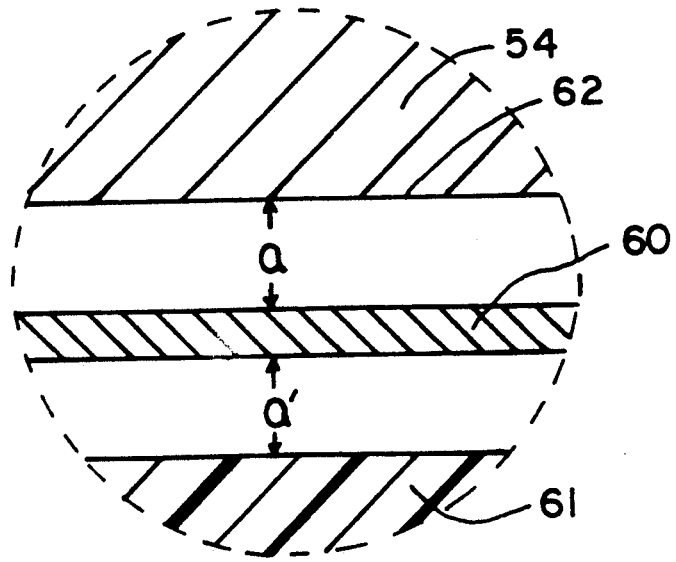
FIG. 8(b) is an enlarged view of the area designated as VIII in the dashed line circle of FIG. 8(a)

As best seen in FIGS. 8(a) and 8(b), the outer and inner electrodes 60 and 61 are separated by a small distance (a). When probe 59 is properly inserted into housing 54, outer electrode 60 is located away from wall 62 of channel 55 a distance (a'), which is equivalent to the distance (a) between outer electrode 60 and inner electrode 61. Openings 63 in outer electrode 60 are then located in channel 56 so as to allow water passing therethrough to exit the housing 54 through stand tube 64.

It should be noted that the distance (a') between channel wall 62 and outer electrode 60 must be substantially equivalent to the distance (a) between outer electrode 60 and inner electrode 61 in order for the probe 59 to deliver accurate readings corresponding to the particular desired water characteristic. The probe 59 may be designed for detection of resistivity, redox, conductivity, or any other well known physical or electrical characteristic of water which is monitorable by probes of this nature.

Figure 6:
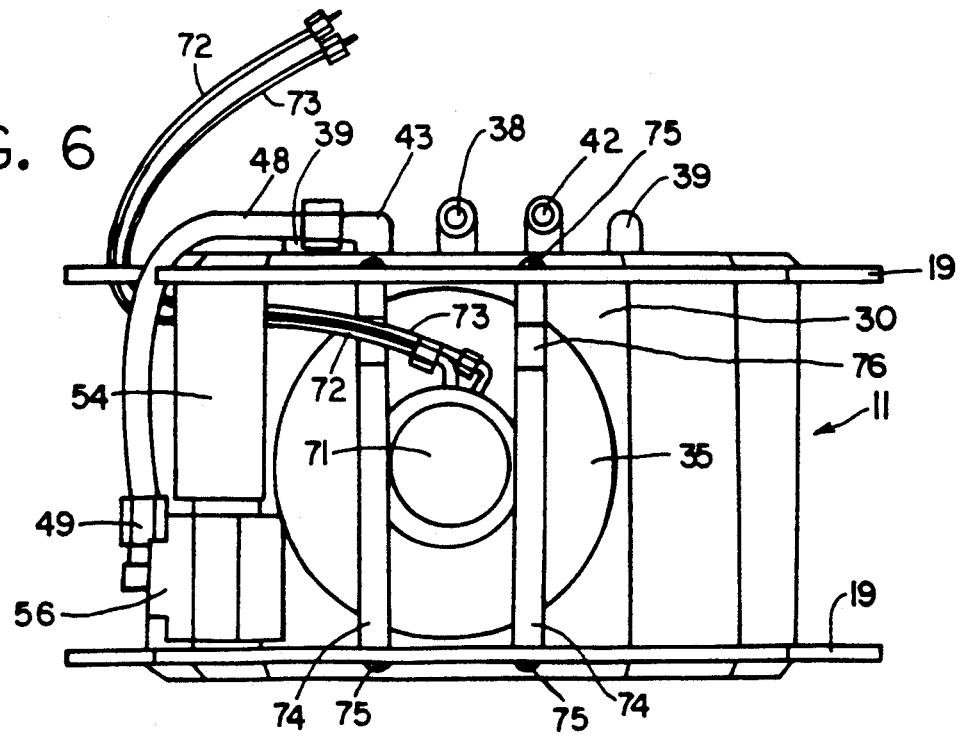
FIG. 6 is a bottom view of the inner tank portion of the present invention.

As best seen in FIGS. 2 and 6, the bottom 30 of tank 11 forms an opening 34 which is completely blocked by dump door 35. The dump door 35 is attached to a piston 69 which is enclosed is chamber 70 by a housing 71. Pneumatic lines 72 and 73 are attached to housing 71 and are fluid connection with the chamber 70. The opposite ends of pneumatic lines 72 and 73 pass from the bottom of the tank 11 and are adapted to be attached for pneumatic operation to the controller 15.

Housing 71 is secured to brace members 74 which are in turn secured to the support members 19 by means of screws 75. Brace member 74 include semi-circular notches 76 which allow the pneumatic lines 72 and 73 to pass from underneath the tank 11 without being pinched off by the brace 74 as they pass thereunder.

Lines 72 and 73 are in fluid connection with chamber 70 in such a manner that one line is located above the piston 69 and one is located below it. Thus, actuation initiated by controller 15 can force air into the chamber 70 either above or below the piston 69, thus causing dump door 35 to move either upward to block opening 34 or downward to allow dumping of fluid from the tank 11 according to the predetermined dump cycle programmed into controller 15.

A pneumatic line (not shown) passes from the controller 15 and separates into two lines as by a T-connection. One line attaching directly to the pneumatic control port 51 of valve 50 and the opposite line connecting directly to a similar pneumatic control port or a similar valve which controls the flow of water into tank 11 through water inlet port 38 and the manifold 31. In this manner, valve 50 and its counterpart controlling flow into tank 11 through inlet port 38 functions simultaneously and are also in the identical state (either on or off). Due to this fact, flow is never allowed to pass into the probe housing 54 unless flow is at the same time passing into tank 11. Further, valve 50 also closes the flow path into probe housing 54 whenever flow through inlet port 38 is stopped.

This feature of the invention insures that the probe 59 located in probe housing 54 is always isolated from tank 11. In other words, water flowing into and contacting probe 59 never can return into tank 11 to cause contamination thereof. When ever valve 50 is open to allow fluid to pass thereby, there is always a positive pressure causing flow always to pass in the direction from the valve into housing 54 and through and out the top of stand pipe 64.

Although the probe 59 is always in contact with fluid which has passed through tank 11, it is usually preferred because of the design of the probe 59, to monitor the fluid characteristics when there is a positive flow of fluid passing through the probe housing 54. This of course occurs whenever fluid is flowing into tank 11 through water inlet port 38, but monitoring is most preferably done during a cascade cycle when the tank 11 is completely filled and overflowing over the weir edge 18 thereof. Under such circumstances, mixing of the liquid in the tank is most effective and readings from the probe 59 are most reflective of the actual fluid characteristic being measured.

Figure 9:
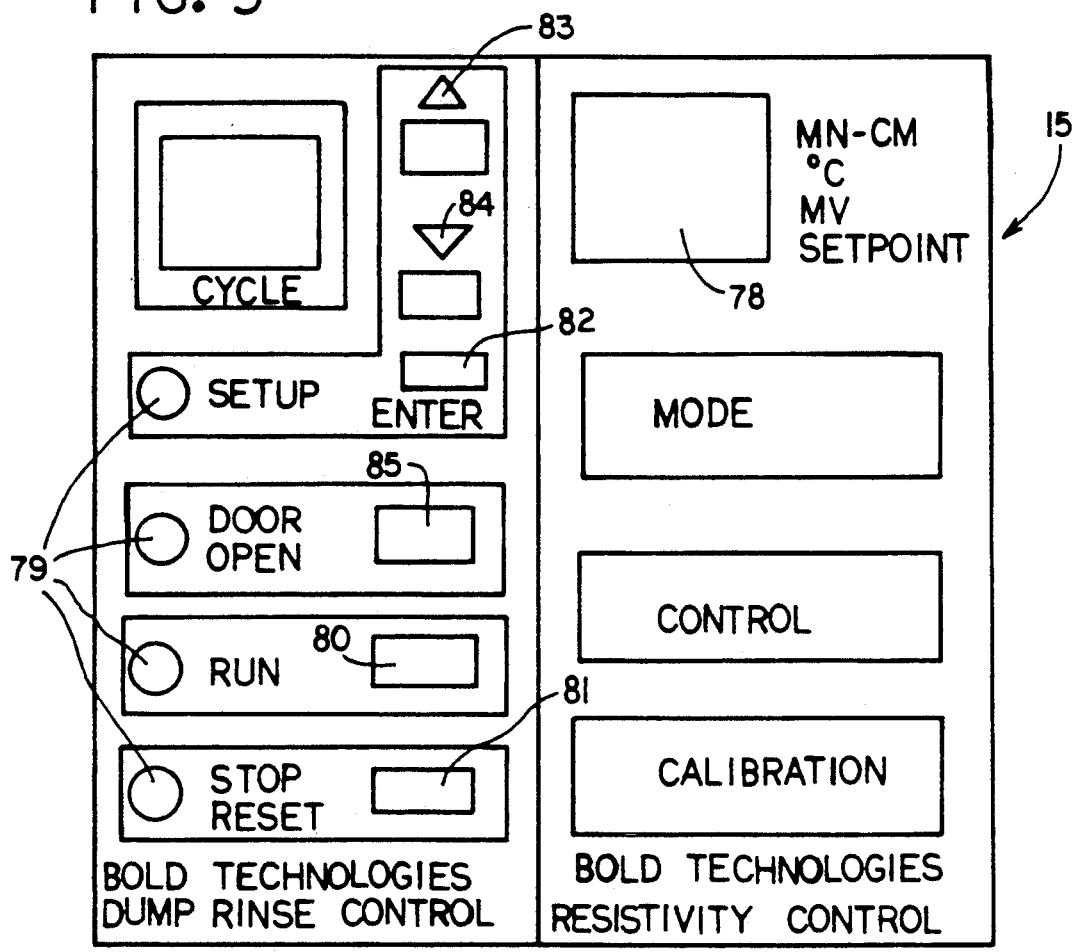
FIG. 9 is a front view of the electronic-pneumatic controller system of the present invention.

FIG. 9 shows a controller 15 developed in accordance with the principles of the present invention. The controller is a self-contained unit capable of implementing several different pre-programed rinsing and cleaning cycles. The controller 15 includes all the necessary pneumatic connections, preferably operated by solenoid, to control the valves required to operate the apparatus 10 of the present invention as has been explained above.

The face 77 of controller 15 includes a display 78 which can display, as desired, either the number of cycles remaining in a pre-programed cleaning and rinsing process, the read out of a probe, such as a numerical value corresponding to mega ohms detected by a resistivity probe, a preset resistivity set point, terminology used in programming the controller 15, etc. There are also four discrete LED's which are provided to indicate the current system status. The LED's correspond to the RUN, STOP/RESET, DOOR OPEN and SETUP status of the controller 15. The run LED indicates that the system is running and implementing a selected program. The display 78 will indicate the number of cycles remaining in the program while in the running mode. The setup LED indicates that the system is in the setup mode. In this mode the system perimeters can be selected for programming the controller 15 for a particular rinsing and cleaning process.

The stop/reset LED if continuously on, indicates that the system is reset, and ready to commence another run. If flashing, the LED indicates that the system is in a standby cascade mode.

The door open LED is used to indicate that the dump door has been manually opened.

The face 77 of the controller 15 also forms a key pad which includes keys corresponding to each of the LED indicators, plus other keys used in programming.

The run key 80 is used to activate the apparatus 10. It will start the apparatus at the beginning of a program, or will continue a program which has been interrupted.

The stop/reset key 81 functions to interrupt a program if depressed during a rinsing and cleaning process. The program can then be resumed by pressing the run key 80. If the stop/reset key 81 is pressed a second time, the program is reset to it's beginning. The enter key 82 is used to put the controller 15 into the setup mode to allow the cycles of a particular clean and rinse process to be programmed therein. The up and down keys 83 and 84 allows a user to scroll through the perimeters corresponding to particular cycles of a process in order to facilitate their programing into the controller 15.

The door open key 85 is used to manually dump the tank 11. When it is depressed, the appropriate solenoid is activated to cause air in chamber 70 to force piston 69 downward to open dump door 35. This process can be manually reversed by depressing the reset key 81.

The controller 15 of the present embodiment of the invention can include from 0 to 99 cycles and can be run on AC or DC current. The solenoids incorporated in the controller 15 can be of any standard manufacturer and are preferably pneumatic solenoids of a maximum PSIG of 100. The solenoids are preferably connected to their corresponding pneumatic valves by means of color coded PVC tubing in a conventional manner.

The inner tank 11 of the present invention is formed of a single rectangular sheet of material which has had slots 92 cut therein at each bending point 88. The sheet 87 is then bent to its proper position as shown in FIG. 2 and side panels line D are then clamped thereto by a custom designed aluminum plate which is inserted into the side of the inner tank 11. The edges of panels 90 are then plastic welded to the sides of sheet 87 on the exterior surface of the tank 11. The welds are then routed to form a 45 degree angle edge 91.

The support members 19 are then plastic welded to the sheet 87, and the spray manifolds 22 and nitrogen manifolds 23 are installed thereto.

The dump door 35 and air cylinder housing 71 are then assembled and mounted by means of brace elements 74 and screws 75 to its position adjacent the bottom 30 of inner tank 11.

Spray nozzles 24 are then installed into the spray manifolds 22 and the support plate 25 is cut, tapered and routed to form wings 27 thereof and then drilled and routed to form holes 26 therein.

It is to be understood that the above described embodiment of the present invention is only illustrative of the application of the principles thereof. Numerous modifications and alternative embodiments or arrangements may be devised by those skilled in the art without departing from the spirit and scope of the present invention and the appended claims are intended to cover such modifications and arrangements.

We claim:

1. An apparatus for cleaning and rinsing wafers used in the production of integrated circuits, said apparatus comprising:
   a tank having a top edge and a bottom, said top edge forming an uninterrupted continuous weir about the entire circumference of said top edge, said bottom having a bottom opening formed therein covered by a door, said top edge forming an opening which is larger than said bottom opening, with said tank having a contour that decreases in cross sectional area from said top edge to said bottom, said tank further including a fluid inlet port formed therein adjacent to said bottom thereof, means for positioning wafers to be cleaned and rinsed within said tank such that the top edges of the wafers are located below the top edge of said tank and the wafers are completely submerged within said tank, control means functionally attached to said door for causing said door to move from a closed position in which said door is in adjacent contacting relationship with said bottom of said tank and completely covering said bottom opening therein and an open position which allows fluid flow through said bottom opening, whereby, cleaning and rinsing fluid can enter through said inlet port into said inner tank and pass upwardly over the wafers to clean and rinse said wafers, with the cleaning and rinsing fluid overflowing said weir edge in a cascading manner when said door is in its closed position, and whereby the cleaning and rinsing fluid can be dumped from said tank through said bottom opening when said door is opened to rapidly drain at least a portion of fluid contained in said tank for exchanging the drained fluid with fresh fluid in said tank.

2. An apparatus for cleaning and rinsing wafers in accordance with claim 1 further including a monitoring means, said monitoring means being in fluid communication with said tank and being controlled by said control means, and means for allowing fluid to exit said tank and enter said monitoring means wherein the fluid is monitored for at least one characteristic indicative of contaminants.

3. An apparatus for cleaning and rinsing wafers in accordance with claim 2 wherein said monitoring means measures the resistivity of the fluid passing therethrough.

4. An apparatus for cleaning and rinsing wafers in accordance with claim 2 wherein said monitoring means measures the conductivity of the fluid.

5. An apparatus for cleaning and rinsing wafers in accordance with claim 2 wherein monitoring means is also provided which measures a characteristic indicative of contaminates of a fluid prior to the fluid entering said tank through the fluid inlet port.

6. An apparatus for cleaning and rinsing wafers according to claim 2 wherein said monitoring means includes a conduit in fluid connection with said tank, a probe housing, and a monitor valve in fluid connection between said conduit and said probe housing, said probe housing forming a fluid chamber which is in fluid connection with said monitor valve, and including a fluid outlet stand pipe, in fluid connection with said chamber, whereby, a probe having electrodes useful for measuring a characteristic indicative of contaminates in the fluid, may be inserted into said chamber in said probe housing such that fluid entering said chamber from said monitor valve must pass over said electrodes before exiting said chamber through said stand pipe.

7. An apparatus for cleaning and rinsing wafers in accordance with claim 6 wherein said monitor valve of said monitoring means is a pneumatic valve and is functionally connected to said control means such that said control means can actuate said monitor valve to an open or closed position, and said fluid inlet port of said tank further includes a pneumaticly actuated fluid inlet valve which controls the flow of fluid into said tank, said fluid inlet valve being functionally connected to said control means, and said control means operating to cause simultaneous opening of said monitor valve and said fluid inlet valve such that both valves are forced by said control means to operate simultaneously, whereby, fluid may flow into said probe housing of said monitoring means only when fluid is simultaneously allowed to flow into said tank through said fluid inlet port.

8. An apparatus for cleaning and rinsing wafers in accordance with claim 1 further including a chemical injection port in fluid communication with said tank, said chemical injection port functioning to allow the introduction of chemicals into said tank.

9. An apparatus for cleaning and rinsing of wafers in accordance with claim 1 further including a hot fluid injection port in fluid communication with said tank, said hot fluid injection port allowing introduction of hot fluid into said tank.

10. An apparatus for cleaning and rinsing of wafers in accordance with claim 1 further including a fluid inlet manifold located in said tank and in fluid communication with said fluid inlet port, said manifold having formed therein a plurality of openings which allow fluid to pass from said manifold into said tank, said openings being sized to allow high velocity non-turbulent fluid flow from said manifold into said tank.

11. An apparatus for cleaning and rinsing of wafers in accordance with claim 1 wherein said tank further includes at least one manifold attached thereto in a position above said top edge thereof, said manifold being connectable to a fluid source and having a plurality of nozzles extending therefrom, said nozzles allowing fluid to flow from said manifold into said tank, said nozzles causing said fluid to be dispersed into a spray as it passes therethrough.

12. An apparatus for cleaning and rinsing wafers in accordance with claim 11 wherein said spray is comprised substantially of fluid particles of approximately 1000 microns in diameter.

13. An apparatus for cleaning and rinsing wafers in accordance with claim 12 wherein said nozzles are full cone adjustable nonatomizing.

14. An apparatus for cleaning and rinsing wafers in accordance with claim 13 wherein said flow from said nozzles of said spray manifolds is controlled by said control means whereby, said control means substantially limits fluid flow from said spray nozzles at all times except when the level of water in said tank is sufficiently high to cover wafers located therein.

15. An apparatus for cleaning and rinsing wafers in accordance with claim 1 wherein said apparatus further includes an outer tank, said tank being completely positionable in said outer tank, said outer tank including a bottom surface having a drain therein, whereby, water passing from said tank collects in said outer tank and passes from said outer tank through said drain in said outer tank.

16. An apparatus for cleaning and rinsing wafers in accordance with claim 1 wherein said tank further includes a support plate which is located in said tank above said fluid inlet port, said support plate including a plurality of openings therethrough capable of allowing passage of fluid, said support plate functioning to support wafers in their proper position in said tank during operation of said apparatus.

* * * * *